US011289597B2

(12) United States Patent
Weber et al.

(10) Patent No.: US 11,289,597 B2
(45) Date of Patent: Mar. 29, 2022

(54) SUPERJUNCTION TRANSISTOR DEVICE WITH SOFT SWITCHING BEHAVIOR

(71) Applicant: Infineon Technologies Austria AG, Villach (AT)

(72) Inventors: Hans Weber, Bayerisch Gmain (DE); Björn Fischer, Munich (DE); Franz Hirler, Isen (DE); Matteo-Alessandro Kutschak, Ludmannsdorf (AT); Andreas Riegler, Lichtpold (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/998,025

(22) Filed: Aug. 20, 2020

(65) Prior Publication Data

US 2021/0057576 A1 Feb. 25, 2021

(30) Foreign Application Priority Data

Aug. 22, 2019 (EP) .................................... 19193018

(51) Int. Cl.
| | | |
|---|---|---|
| *H01L 29/78* | (2006.01) | |
| *H01L 29/06* | (2006.01) | |
| *H01L 29/423* | (2006.01) | |
| *H01L 29/40* | (2006.01) | |
| *H01L 21/8234* | (2006.01) | |
| *H01L 29/66* | (2006.01) | |
| *H01L 27/24* | (2006.01) | |

(52) U.S. Cl.
CPC .. *H01L 29/7813* (2013.01); *H01L 21/823487* (2013.01); *H01L 27/2454* (2013.01); *H01L 29/0634* (2013.01); *H01L 29/0649* (2013.01); *H01L 29/407* (2013.01); *H01L 29/4236* (2013.01); *H01L 29/42356* (2013.01); *H01L 29/66734* (2013.01); *H01L 29/7827* (2013.01)

(58) Field of Classification Search
CPC ............ H01L 29/0634; H01L 29/7813; H01L 29/4236; H01L 29/66734; H01L 29/7827; H01L 29/42356; H01L 29/0696; H01L 29/407; H01L 21/823487; H01L 27/2454
See application file for complete search history.

(56) References Cited

U.S. PATENT DOCUMENTS

| | | |
|---|---|---|
| 8,803,205 B2 | 8/2014 | Willmeroth et al. |
| 11,094,780 B2 * | 8/2021 | Weis .................... H01L 29/0634 |
| 2008/0035992 A1 | 2/2008 | Kawaguchi et al. |
| | (Continued) | |

*Primary Examiner* — Joseph C. Nicely
(74) *Attorney, Agent, or Firm* — Murphy, Bilak & Homiller, PLLC

(57) ABSTRACT

A transistor device is enclosed. The transistor device includes: a semiconductor body; a plurality of drift regions of a first doping type; a plurality of compensation regions of a second doping type adjoining the drift regions; and a plurality of transistor cells each including a body region adjoining a respective one of the plurality of drift regions, a source region adjoining the body region, and a gate electrode adjacent the body region and dielectrically insulated from the body region by a gate dielectric. The source regions of the plurality of transistor cells are connected to a source node, the body regions of the plurality of transistor cells are separated from the plurality of compensation regions in the semiconductor body, and the plurality of compensation regions are ohmically connected to the source node.

22 Claims, 7 Drawing Sheets

(56) References Cited

U.S. PATENT DOCUMENTS

| | | |
|---|---|---|
| 2009/0250727 A1 | 10/2009 | Lin |
| 2016/0118492 A1 | 4/2016 | Asada et al. |
| 2017/0125515 A1 | 5/2017 | Shirakawa et al. |
| 2019/0157385 A1* | 5/2019 | Shirakawa .......... H01L 29/7813 |
| 2020/0235230 A1* | 7/2020 | Zhang ................ H01L 29/6634 |
| 2020/0287535 A1* | 9/2020 | Weber ................ H01L 29/7813 |
| 2020/0357918 A1* | 11/2020 | Cina' .................. H01L 29/4236 |

\* cited by examiner

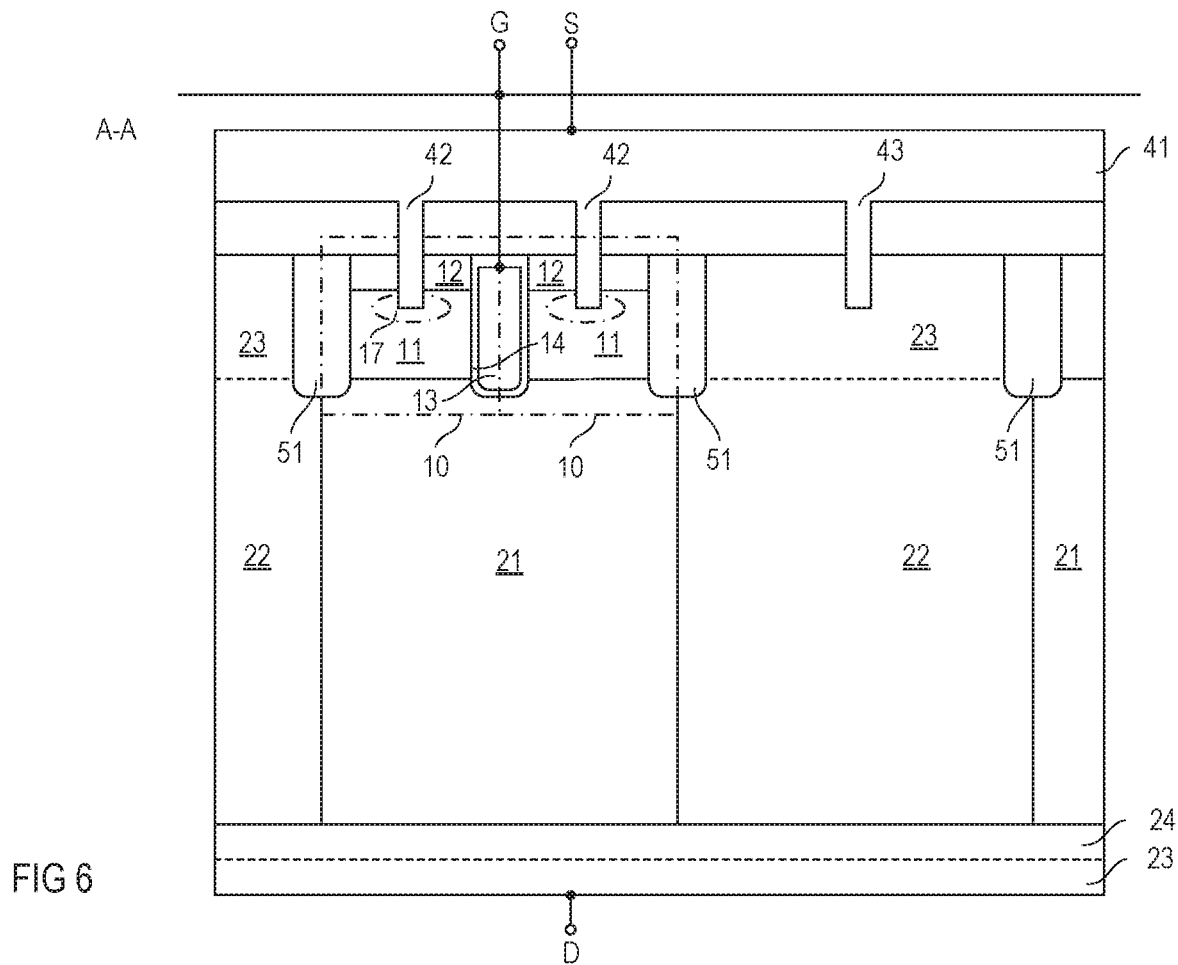
FIG 6
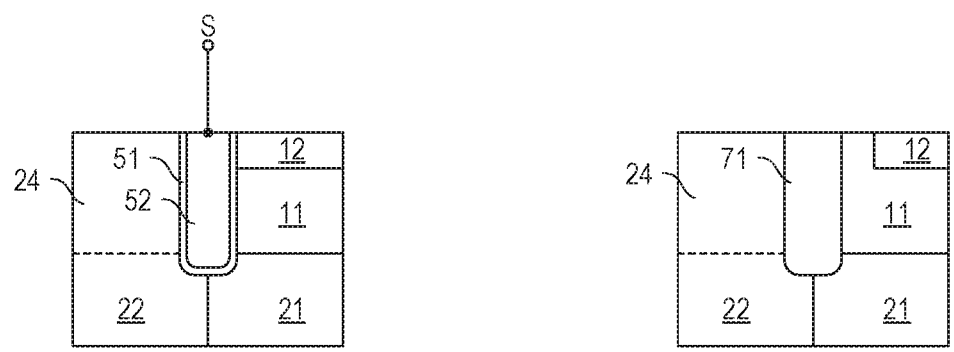
FIG 7
FIG 8

SUPERJUNCTION TRANSISTOR DEVICE WITH SOFT SWITCHING BEHAVIOR

TECHNICAL FIELD

This disclosure relates in general to a transistor device, in particular a superjunction transistor device.

BACKGROUND

A superjunction transistor device usually includes a drain region, plurality of drift regions of a first doping type, a plurality of compensation regions of a second doping type adjoining the drift regions, and a plurality of transistor cells. Each of the transistor cells includes a body region adjoining one of the drift regions, a source region adjoining the body region, and a gate electrode adjacent the body region and dielectrically insulated from the body region by a gate dielectric.

Superjunction transistor devices can be operated in an on-state and an off-state. In the on-state, a drive voltage (gate-source voltage) is applied between the gate electrode and the source region of each transistor cell such that there is a conducting channel in the body region between the source region and the drift region. In the on-state, a load current can flow between the drain region and the source regions when a voltage is applied between the drain region and the source regions. In the off-state, the gate electrodes of the transistor cells are driven such that the conducting channels in the body regions are interrupted, so that the load current is zero.

Superjunction transistor devices are capable of rapidly changing the switching state from the on-state to the off-state, or vice versa. Thus, switching on or switching off the transistor device may be associated with high gradients (transients, slopes) of the load current. High load current gradients, however, may cause voltage spikes of voltages across resonant circuits or any kind of non-parasitic or parasitic inductances, such as line inductances of connection lines between the transistor device and a load and/or a power source. Such voltage spikes may damage electronic devices in the same circuit as the transistor device or may cause high voltages a gate node of the transistor device, wherein such high voltages (which are sometimes referred to as gate ringing) may damage the transistor device.

There is therefore a need for a superjunction transistor device with an improved switching behavior.

SUMMARY

One example relates to a transistor device. The transistor device includes a semiconductor body, a plurality of drift regions of a first doping type, a plurality of compensation regions of a second doping type adjoining the drift regions, and a plurality of transistor cells. Each of the transistor cells includes a body region adjoining a respective one of the plurality of drift regions, a source region adjoining the body region, and a gate electrode adjacent the body region and dielectrically insulated from the body region by a gate dielectric. The source regions of the plurality of transistor cells are connected to a source node, the body regions of the plurality of transistor cells are separated from the plurality of compensation regions in the semiconductor body, and the plurality of compensation regions are ohmically connected to the source node.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIG. 6 illustrates a modification of the transistor device shown in FIG. 1, wherein the transistor device includes isolation regions between body regions and compensation regions;

FIG. 7 illustrates an isolation region according to another example;

FIG. 8 illustrates an isolation region according to yet another example; and

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
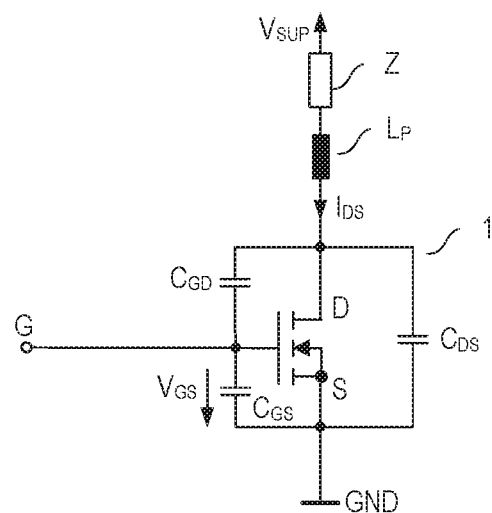
FIG. 1 illustrates one example of an electronic circuit that includes a transistor device as an electronic switch.

FIG. 1 illustrates an electronic circuit that includes a transistor device 1 and a load Z. In this electronic circuit, the transistor 1 is used as an electronic switch for switching a load current $I_{DS}$ through the load Z. The transistor device 1 includes a drive input G-S configured to receive a drive voltage $V_{GS}$ and a load path D-S connected in series with the load Z. The series circuit including the load path D-S of the transistor device 1 and the load Z receives a supply voltage $V_{SUP}$ from a voltage source (not shown). The load Z may include any kind of electric load or load circuit.

The transistor device 1 shown in FIG. 1 is a MOSFET, more specifically, an n-type enhancement MOSFET. The load path of this type of transistor device is an internal current path between a drain node D and a source node S of the transistor device. Further, the drive input is formed by a gate node G and the source node S (as illustrated in FIG. 1) or by an additional circuit node (not shown in FIG. 1). In this type of transistor device, the drive voltage $V_{GS}$ may also be referred to as gate-source voltage. However, implementing the transistor device 1 as an n-type enhancement MOSFET is only an example. Other examples of the transistor device 1 include an n-type depletion MOSFET, or a p-type enhancement or depletion MOSFET. According to one example, the transistor device is implemented as a superjunction transistor device.

The transistor device 1 switches on or off dependent on a voltage level of the drive voltage $V_{GS}$ received at the drive input G-S. The transistor device 1 is in an on-state, in which it is capable of conducting a load current $I_{DS}$ different from zero, when the drive voltage $V_{GS}$ is higher than a threshold voltage of the transistor device 1. Further, the transistor device 1 is in an off-state, in which it is capable of blocking the load current $I_{DS}$, when the drive voltage $V_{GS}$ is below the threshold voltage. In an n-type enhancement MOSFET, for example, the threshold voltage is a positive voltage of between 1V and 5V, for example. Dependent on the specific implementation of the transistor device 1, a voltage blocking capability of the transistor device 1 may range between 10V and several 100V, such as 600V, or even several kilovolts (kV), for example. The "voltage blocking capability" is the maximum voltage the transistor device 1 can withstand between its load nodes D, S.

The load current $I_{DS}$ through the transistor device 1 changes, for example, when the switching state of the transistor device 1 changes. The changing load current $I_{DS}$ may result in voltage spikes across inductances in the electronic circuit. These inductances may include (non-parasitic) inductances in the load Z or parasitic inductances, wherein parasitic inductances may include line inductances of any kind of connection lines included in the electronic circuit. Just for the purpose of illustration, inductor $L_P$ in the electronic circuit shown in FIG. 1 represents the parasitic inductances of connection lines between the transistor device 1, the load Z, and the power supply terminals where the supply voltage $V_{SUP}$ is available. This, however, is only an example. Dependent on the specific implementation of the electronic circuit it may include further parasitic or non-parasitic inductances across which voltage spikes induced by a rapidly changing load current $I_{DS}$ may occur. Basically, the higher the gradient of the load current $I_{DS}$, the higher a voltage level of voltage spikes that may occur when the transistor device 1 changes its switching state.

Referring to FIG. 1, the transistor device includes a gate-source capacitance $C_{GS}$, which is a capacitance between the gate node G and the source node S, a gate-drain capacitances $C_{GD}$, which is a capacitance between the gate node G and the drain node D, and a drain-source capacitance $C_{DS}$, which is a capacitance between the drain node D and the source node S. These capacitances $C_{GS}$, $C_{GD}$, $C_{DS}$ are internal capacitances and are represented by capacitors in the circuit diagram shown in FIG. 1. The switching state of the transistor device 1 is dependent on a charging state of the gate-source capacitance $C_{GS}$, wherein the transistor device is in the on-state when the gate-source capacitance has been charged such that the gate-source voltage $V_{GS}$, which is the voltage across the gate-source capacitance $C_{GS}$, is higher than a threshold voltage.

The gradient of the load current $I_{DS}$, when the transistor device changes its switching state, is, inter alia, dependent on an output capacitance Coss of the transistor device, wherein the output capacitance Coss is given by the gate-drain capacitance $C_{GD}$ plus the drain-source capacitance $C_{DS}$ (Coss=$C_{GD}$+$C_{DS}$). More specifically, the gradient of the load current $I_{DS}$ and also a gradient of the drain-source voltage $V_{DS}$ are dependent on charging or discharging the output capacitance Coss when the transistor device changes its switching state.

Figure 2:
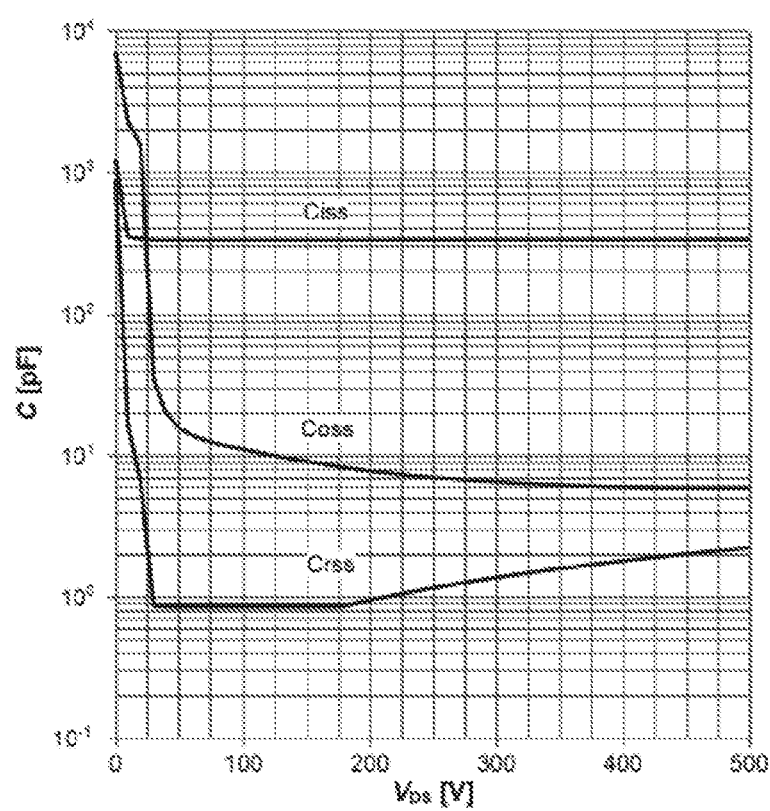
FIG. 2 illustrates the dependency of an output capacitance of a superjunction transistor device on a drain-source voltage.

In a superjunction transistor device, the output capacitance Coss and a feedback capacitance Crss (which is given by the gate-drain capacitance $C_{GD}$) are highly dependent on the drain-source voltage $V_{DS}$, which is the voltage between the drain node D and the source node S. This is illustrated in FIG. 2, which illustrates the capacitance characteristics of a typical superjunction transistor device with a voltage blocking capability of 800V dependent on the drain-source voltage $V_{DS}$. As can be seen from FIG. 2, for each of the output capacitance Coss and the feedback capacitance Crss there is a voltage range of the drain-source voltage $V_{DS}$ in which the respective capacitance Coss, Crss steeply decreases as the drain-source voltage $V_{DS}$ increases. The drain-source voltage $V_{DS}$ increases when the transistor device 1 switches off.

When the transistor device switches off, for example, the load current (drain-source current) $I_{DS}$ charges the output capacitance Coss. Referring to the above, there is a strong dependency of the output capacitance Coss on the drain-source voltage $V_{DS}$ such that the output capacitance Coss significantly decreases to low capacitance values as the drain source voltage $V_{DS}$ increases within a certain voltage range. This may have the effect that drain-source-voltage $V_{DS}$ steeply increases over time and/or the load current $I_{DS}$ steeply decreases over time when the transistor device 1 switches off.

Referring to the above, a high gradient (a steep increase) of the load current $I_{DS}$ may cause high voltage spikes of voltages across (parasitic or non-parasitic) inductances in the electronic circuit. Such voltage spikes are undesirable in view of EMI (electromagnetic interference). Further, due to the capacitive coupling between the gate node G and the load path (the drain-source path D-S) via the gate-drain capacitance $C_{GD}$ such voltage spikes may cause high voltages at the gate node G, which may even cause the transistor device to be damaged or destroyed. There is therefore a need for a transistor device, in particular a superjunction transistor device, with an improved switching behavior (a soft switching behavior), that is, with a relatively low time gradient of the load current $I_{DS}$ and the drain-source-voltage $V_{DS}$ when the transistor device switches on or off.

Figure 3:
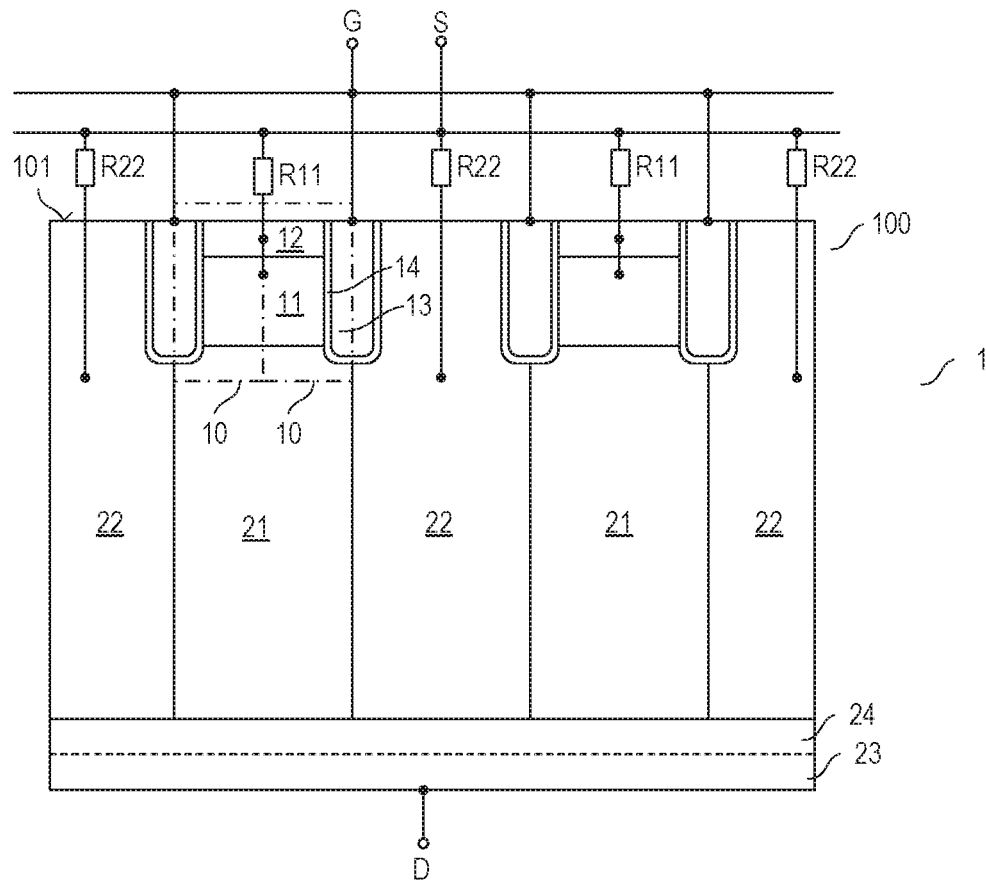
FIG. 3 schematically illustrates a vertical cross sectional view of a superjunction transistor device that includes a plurality of transistor cells according to one example.

FIG. 3 illustrates a vertical cross sectional view of a superjunction transistor device 1 with an improved switching behavior according to one example. More specifically, FIG. 3 illustrates a vertical cross sectional view of a semiconductor body 100 in which active device regions of the transistor device 1 are integrated.

Referring to FIG. 3, the transistor device includes a semiconductor body 100 and a plurality of drift regions 21 of a first doping type and a plurality of compensation regions 22 of a second doping type, wherein the drift regions 21 and the compensation regions 22 adjoin each other. The transistor device further includes a plurality of transistor cells each comprising a body region 11 adjoining a respective one of the plurality of drift regions 21, a source region 12 adjoining the body region 11, and a gate electrode 13. The gate electrode 13 of each transistor cell 10 is arranged adjacent the body region 11 of the respective transistor cell 10 and is dielectrically insulated from the body region 11 by a gate dielectric 14. The source regions 12 and the body regions 11 of the plurality of transistor cells 10 are connected to a source node S of the transistor device and the plurality of compensation regions 22 are connected to the source node S. The source node S and connections between the source regions 12, body regions 11, and compensation regions 22 and the source node S are only schematically illustrated in FIG. 1. Examples for implementing these connections are explained herein further below.

Referring to FIG. 3, the body regions 11 of the plurality of transistor cells 10 are separated from the plurality of compensation regions 22 in the semiconductor body 100. Thus, unlike a conventional superjunction transistor device, the compensation regions 22 are not connected to the source node S via the body regions 11. In this way, electrical resistances R22 between the compensation regions 22 and the source node S can be suitably adjusted in order to obtain a soft switching behavior without affecting the on-resistance $R_{DS\_ON}$. This is explained in detail herein further below. The "on-resistance" is the electrical resistance between the drain node D and the source node S of the transistor device 1 in the on-state.

Referring to FIG. 3, the gate electrodes 13 of the individual transistor cells 10 are connected to the gate node G, wherein the gate node G and connections between the gate node G and the gate electrodes 13 are only schematically illustrated in FIG. 3. The gate-source capacitance $C_{GS}$ (see FIG. 1) of the transistor device is given by the capacitance between the gate node G and the source regions 12 and the body regions 11.

Referring to FIG. 3, the transistor device further includes a drain region 23. The drain region 23 may adjoin the drift regions 21 and the compensation regions 22. Optionally, as illustrated in dashed lines in FIG. 3, a buffer region 24 of the first doping type may be arranged between the drain region 24 and each of the drift regions 21 and the compensation regions 22. The drain region 23 forms the drain node D of the transistor device or is connected to the drain node D.

The transistor device shown in FIG. 3 is a vertical transistor device, which is a transistor device in which the drain region 24 is spaced apart from the source regions 12 in a vertical direction of the semiconductor body 100. The "vertical direction" is a direction perpendicular to a first surface 101 of the semiconductor body 100, wherein the "first surface 101" is the surface below which the source regions 12 and the body regions 11 are arranged in the semiconductor body 100. However, implementing the transistor device as a vertical transistor device is only an example. The transistor device may also be implemented as a horizontal transistor device, which is a transistor device in which the drain region is spaced apart from the source regions in a lateral direction of the semiconductor body 100. The "lateral direction" is a direction parallel to the first surface 101.

Further, in the transistor device shown in FIG. 3, the gate electrodes 13 are trench electrodes, which are electrodes arranged in trenches that extend from the first surface 101 into the semiconductor body 100. This, however, is only an example. The gate electrodes 13 may also be implemented as planar electrodes (not shown) that are arranged above the first surface 101.

In the example illustrated in FIG. 3, the body regions 11 are separated from the compensation regions 22 by the gate electrodes 13 and the gate dielectrics 14. However, this is only one example of how the body regions 11 and the compensation regions 22 may be separated from each other. Further examples are explained herein further below.

According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like. According to one example, the semiconductor body 100 includes monocrystalline silicon and the individual active device regions are implemented such that a respective doping concentration is in a range as outlined in the following: drift region 11: between 1E15 $cm^{-3}$ and 1E17 $cm^{-3}$; compensation region 12: between 1E15 $cm^{-3}$ and 1E17 $cm^{-3}$; body region 13: between 1E17 $cm^{-3}$ and 1E18 $cm^{-3}$; source region 14: between 1E18 $cm^{-3}$ and 1E21 $cm^{-3}$; drain region 17: between 1E18 $cm^{-3}$ and 1E21 $cm^{-3}$; optional buffer region 18: between 1E14 $cm^{-3}$ and 1E17 $cm^{-3}$.

The gate electrodes 13 may include a metal or a highly doped polycrystalline semiconductor material such as polysilicon. The gate dielectrics 14 may include a semiconductor oxide such as silicon oxide.

The transistor device can be an n-type transistor device or a p-type transistor device. In an n-type transistor device, the source regions 12 and the drift regions 21 are n-type semiconductor regions and the body regions 11 and the compensation regions 22 are p-type semiconductor regions. In a p-type transistor device the doping types of the individual active device regions are complementary to the doping type of corresponding device regions in an n-type transistor device. Further, the transistor device can be implemented as a MOSFET (Metal Oxide Semiconductor Field-Effect Transistor) or as an IGBT (Insulated Gate Bipolar Transistor). In a MOSFET, the drain region 23 has the same doping type as the source regions 12. In an IGBT (Insulated Gate Bipolar Transistor), the drain region 23 has a doping type complementary to the doping type of the source regions 12.

Figure 4:
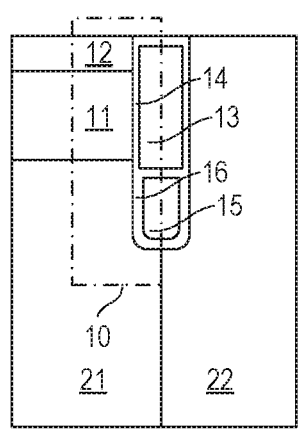
FIG. 4 illustrates a transistor cell according to another example.

Optionally, each transistor cell may further include a field electrode 15 that is adjacent the drift region 21 and dielectrically insulated from the drift region 21 by a field electrode dielectric 16. This is illustrated in FIG. 4 that shows one transistor cell and sections of one drift region 21 and one compensation region 22. The field electrode 15 may be connected to the source node S or the gate node G. A connection between the field electrode 15 and one of the source node S and the gate node G, however, is not illustrated in FIG. 4.

The transistor device can be operated in an on-state or an off-state. In the on-state, the gate electrode 13, by applying a suitable gate-source voltage $V_{GS}$ between the gate node G and the source node S, of each transistor cell 10 is driven such that there is a conducting channel in the respective body region 11 between the source region 14 and the drift region 21 adjoining the body region 11. By virtue of this conducting channel a current can flow between the drain node D and the source node S when a drain-source voltage $V_{DS}$ higher than zero is applied between the drain node D and the source node S. In the off-state, the gate electrodes 13 are driven such that the conducting channels in the body regions 11 between the source regions 12 and the drift regions 21 are interrupted. In the off-state, when applying a voltage between the drain node D and the source node S that reverse biases pn-junctions between the drift regions 21 on one side and the body regions 11 and compensations regions 22 on the other side, space charge regions (depletion regions) expand in the semiconductor body 100. In this operating state, a current flow through the transistor device is prevented.

In the transistor device shown in FIG. 3, the drain-source capacitance $C_{DS}$, which is a significant portion of the output capacitance Coss, includes a first junction capacitance between the body regions 11 and the drift regions 21 and a second junction capacitance between the compensation regions 22 and the drift regions 21. When the transistor device switches from the on-state to the off-state dopant atoms in the body regions 11, the drift regions 21 and the compensation regions 22 are ionized so that charge carriers are "stored" in the junction capacitances, in particular, the second junction capacitance formed by the drift and compensation regions 21, 22. When the transistor device switches from the off-state to the on-state, these stored charge carriers are removed so that the transistor device can conduct a current. Charging and discharging the junction capacitances is associated with a current flow of the drain-source current $I_{DS}$.

In the transistor device according to FIG. 3, charging and discharging the junction capacitances is dependent on resistances R22 between the compensation regions 22 and the source node S. Thus, the drain-source current $I_{DS}$ and, in particular, the gradient of the drain-source current $I_{DS}$ when the transistor device 1 switches off, can be adjusted by suitably adjusting these resistances R22. These resistances are referred to as first resistances R22 in the following. Basically, e.g. for the off-switching behavior, the higher the first resistances R22, the lower the gradient of the drain-source current $I_{DS}$ before the drain-source current $I_{DS}$ finally decreases to zero. Thus, by separating the body regions 11 from the compensation regions and by suitably adjusting the resistances R22 between the compensation regions 22 and the source node S an improved (soft) switching behavior is achieved.

In FIG. 3, R11 denotes resistances between the source and body regions 12, 11 of the transistor cells 10 and the source node S. These resistances R11, which are referred to as second resistances in the following, affect the on-resistance of the transistor device 1, wherein the lower these second resistances R11, the lower the on-resistance.

In order to achieve a low on-resistance it may be desirable to implement the second resistors R11 as low as possible. Further, in order to achieve a soft switching behavior it is desirable to implement the first resistors R22 such that charging and discharging the second junction capacitance is slowed down as compared to a conventional device in which the compensation regions are coupled to the source node via the body regions.

Figure 5A:
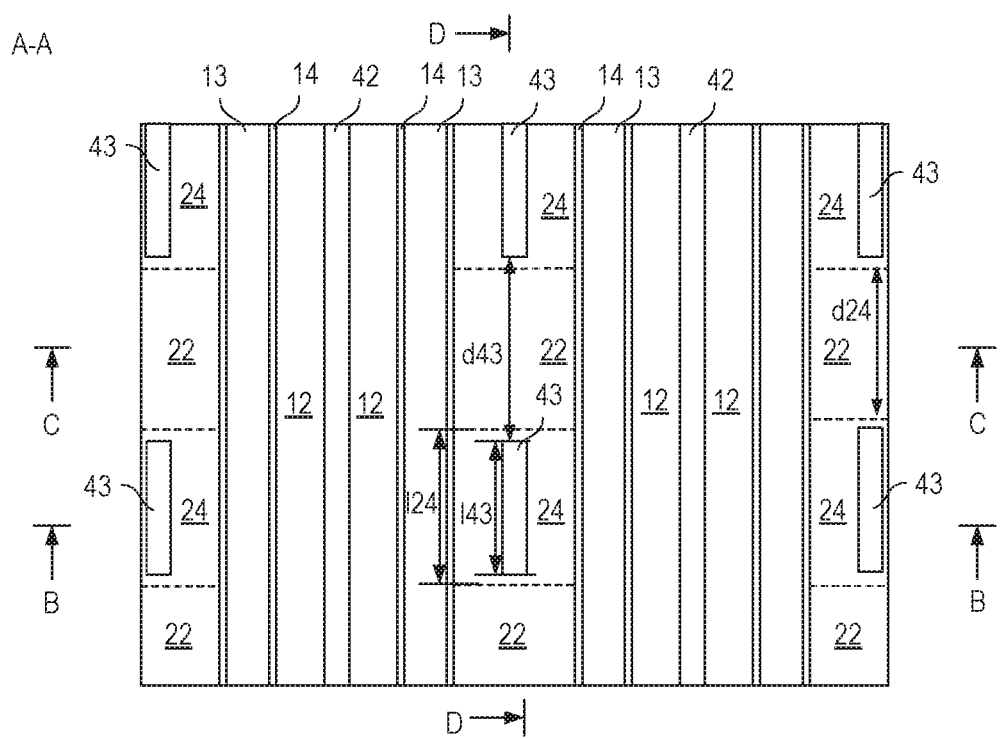
FIGS. 5A-5D illustrate a horizontal cross sectional view and three vertical cross sectional views of a transistor device of the type illustrated in FIG. 2.
Figure 5B:
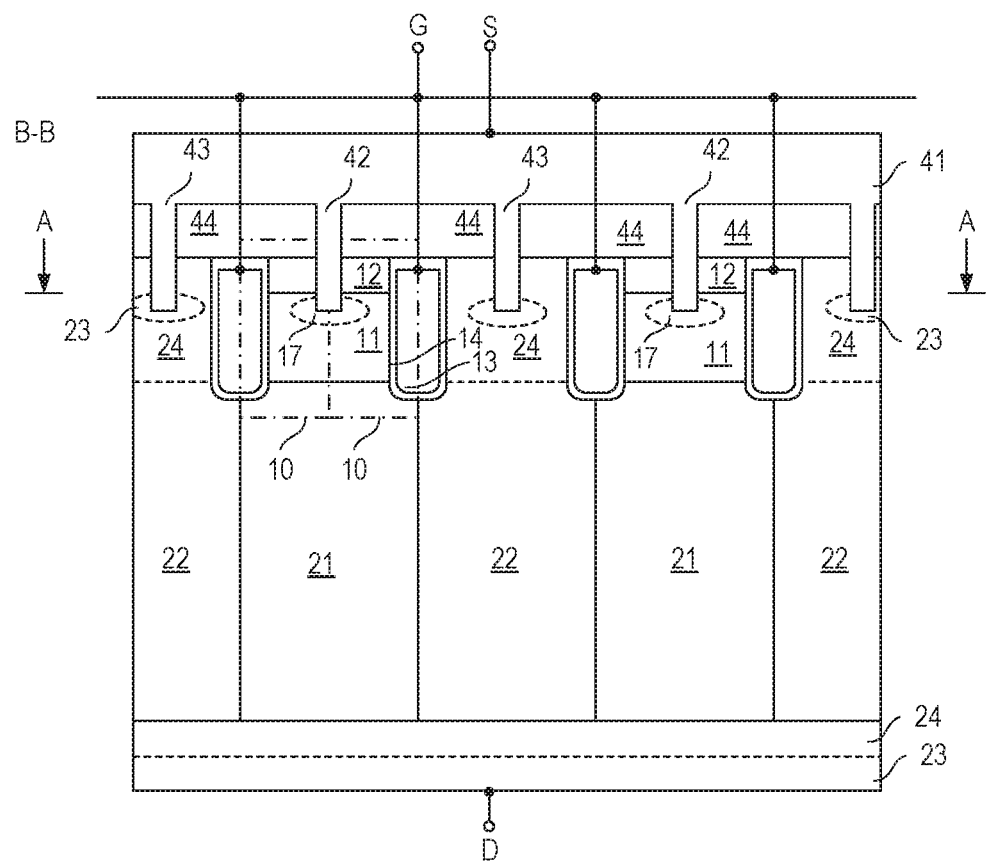
Figure 5C:
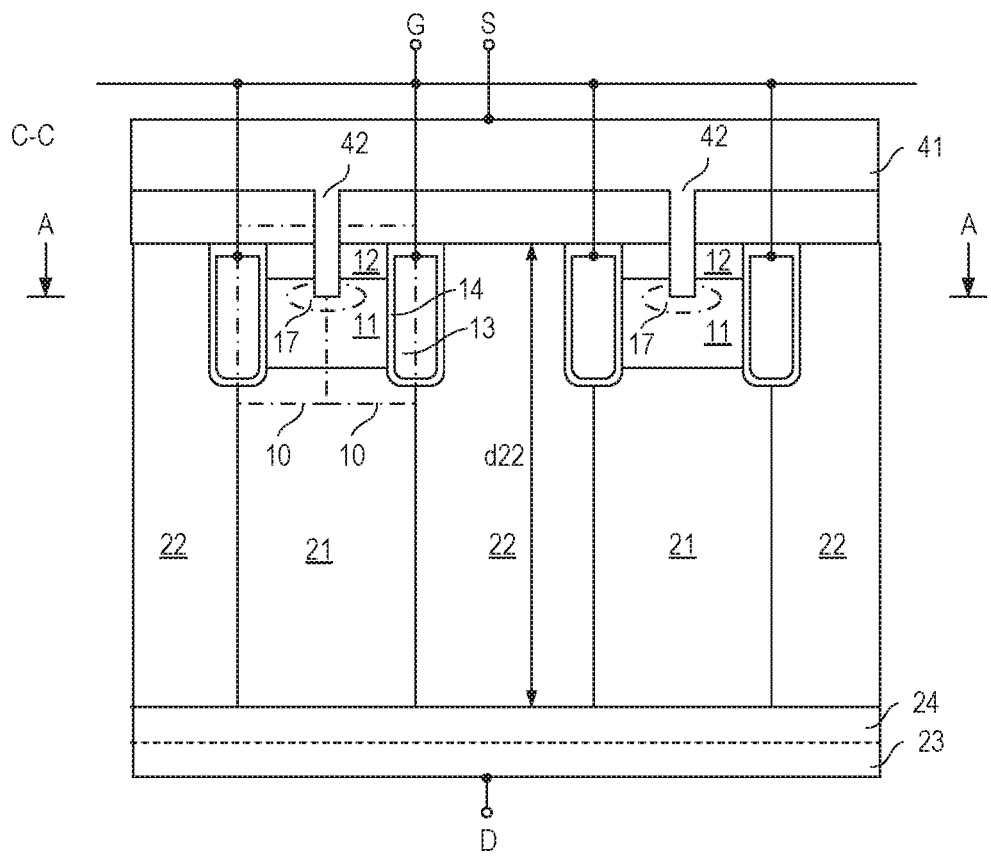
Figure 5D:
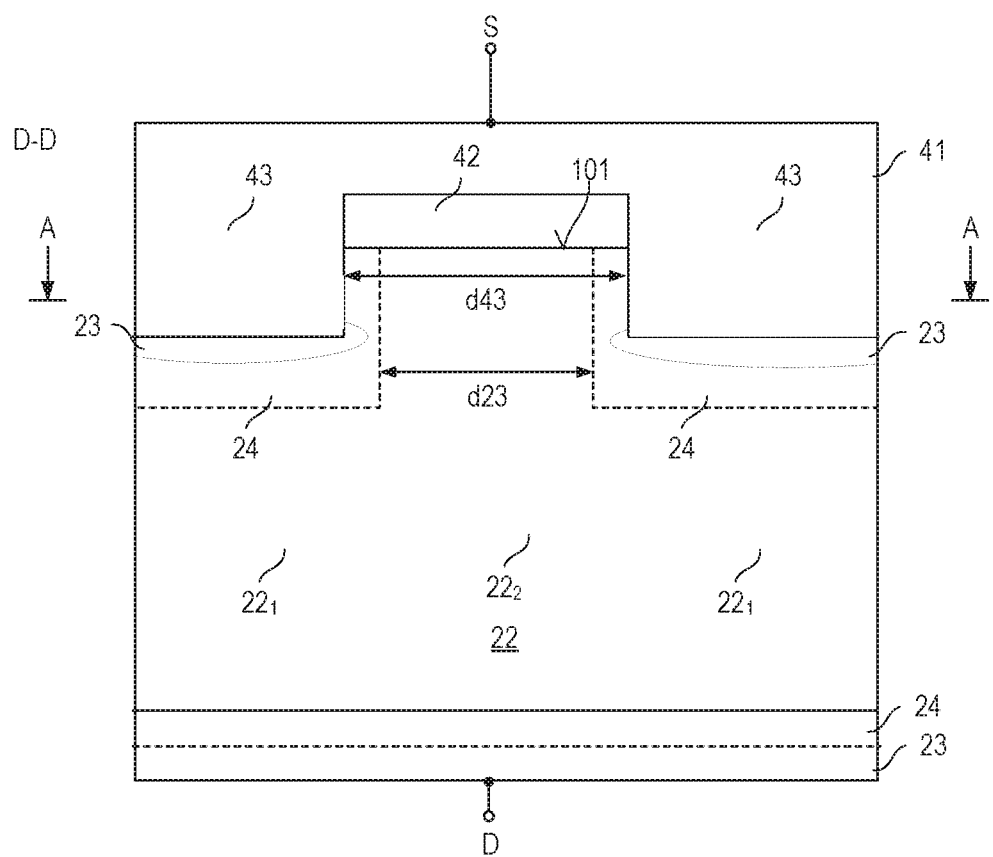

The first resistances R22 between the compensation regions 22 and the source node S may be adjusted in various ways. One example for adjusting these resistances R22 is illustrated in FIGS. 5A to 5D. FIG. 5A shows a horizontal cross sectional view of a transistor device of the type shown in FIG. 3 in a horizontal section plane A-A that is essentially parallel to the first surface 101 of the semiconductor body 100 and cuts through the source regions 12 of the individual transistor cells 10; FIG. 5B shows a vertical cross sectional view of the transistor device in a first vertical section plane B-B illustrated in FIG. 5A; FIG. 5C shows a vertical cross sectional view of the transistor device in a second vertical section plane C-C illustrated in FIG. 5A; and FIG. 5D shows a vertical cross sectional view of the transistor device in a third vertical section plane D-D illustrated in FIG. 5A. Referring to FIG. 5A, the compensation regions 22 are elongated semiconductor regions. Equivalently, the drift regions 21, which are out of view in FIG. 5A and located below the source regions 12 and the body regions 11 (which are also out of view in FIG. 5A), are elongated semiconductor regions that are essential parallel to the compensation regions 22. The gate electrodes 13 are elongated electrodes arranged between the source regions 12 and the body regions 11 on one side and the compensation regions 22 on the other side.

Referring to FIGS. 5B to 5D, the transistor device includes a source metallization 41 that is arranged above the first surface 101 on top of an insulation layer 44. The source metallization 41 forms the source node S of the transistor device or is connected to the source node S of the transistor device. The source metallization 41 is connected to the source regions 12 and the body regions 11 of the individual transistor cells 10 via first contact plugs 42, wherein these first contact plugs 42 extend from the source metallization 41 through the insulation layer 44 to the source and body regions 12, 11. Further, the source metallization 41 is connected to the compensation regions 22 via second contact plugs 43 that extend from the source metallization 41 through the insulation layer 44 to the first surface 101 of the semiconductor body 100 or into the semiconductor body 100.

The first contact plugs 42 are ohmically connected to the source and body regions 12, 11. That is, there is no rectifying junction between the first contact plugs 42 and the source and body regions 12, 11. In order to achieve an ohmic contact between the first contact plugs 42 and the body regions 11 first contact regions 17 of the same doping type as the body regions 11, but more highly doped than the body regions 11, may be arranged between the first contact plugs 42 and the body regions 11. According to one example, the doping concentration of the source regions 12 is high enough to provide for an ohmic contact between the source regions 12 and the first contact plugs 42, so that additional contact regions between the first contact plugs 42 and the source regions 12 may be not necessary.

The second contact plugs 43 are ohmically connected to the compensation regions 22. That is, there is no rectifying junction between the second contact plugs 43 and the compensation regions 22. For this, the transistor device may include highly doped second contact regions 23 that adjoin the second contact plugs 43 and that are arranged between the second contact plugs 43 and the compensation regions 22. The second contact regions 23 have the same doping type as the compensation regions 22 and a doping concentration that is high enough to provide for an ohmic contact between the second contact regions 23 and the second contact plugs 43.

Referring to FIG. 5A, each of the compensation regions 22 may be connected to the source metallization 41 through a plurality of second contact plugs 43, wherein these second contact plugs 43 are spaced apart from each other. In the example shown in FIG. 5A, in which the compensation regions 22 are elongated regions, the second contact plugs 43 are spaced apart from each other in a longitudinal direction of the compensation regions 22. The "longitudinal direction" of a compensation region 22 is a direction perpendicular to a direction in which the compensation region 22 adjoins neighboring drift regions 21.

The respective first resistance R22 arranged between each compensation region 22 and the source metallization can be adjusted by adjusting a distance d43 between neighboring second contact plugs 43. In this context it should be noted that each of the first resistances R22 is not a lumped resistance, but may be considered to include a plurality of sub-resistances, wherein each of these sub-resistances connects a respective portion of the compensation region 22 and, therefore, a respective portion of the second junction capacitance to the source metallization 41. Between portions of the compensation regions 22 located below the second contact plugs 43 and the source metallization 41, for example, there is a lower sub-resistance than between portions of the compensation regions 22 not located below the second contact plugs 43 and the source metallization 41. This is explained with reference to FIG. 5D.

FIG. 5D shows a vertical cross sectional view of a compensation region 22 in a vertical section plane D-D that extends in the longitudinal direction of the compensation region 22 and cuts through the second contact plugs 43. When the transistor device switches off dopant atoms in the compensation region 22 are ionized. This ionization is associated with charging the second junction capacitance.

Ionizing the dopant atoms in the compensation region 22 includes a charge carrier flow between the source metallization 41 and the compensation region 22. According to one example, the electrical resistance of the contact plugs 43 and the source metallization 41, which may include a metal or a highly doped polycrystalline semiconductor material, can be neglected as compared to the electrical resistance of the compensation region 22. In this case, the electrical resistance between certain portions of the compensation region 22 and the source metallization 41 is mainly dependent on a shortest distance between the respective portion of the compensation region 22 and the nearest second contact plug 43. Thus, between first portions $22_1$ of the compensation region 22 that are located directly below a second contact plug 43 and the source metallization 41 there is a lower sub-resistance than between second portions $22_2$ of the compensation region 22 that are not located directly below a second contact plug 43 and the source metallization 41. In order to reach the nearest second contact plug 43, charge carriers from the first portions $22_1$ essentially have to travel in the vertical direction of the semiconductor body 100, and charge carriers from the second portions $22_2$ essentially have to travel both in the vertical direction and the lateral direction. In this way, charging the second junction capacitance is slowed down. Thus, by suitably implementing the dimensions of the second portions $22_2$ the rate of charging (and discharging) the second junction capacitance and, therefore, the gradient of the drain-source current $I_{DS}$ can be limited.

According to one example, the second contact plugs 43 are implemented such that the distance d43 between neighboring second plugs 43 is dependent on a (maximum) vertical dimension d22 of the compensation region 22. According to one example, the distance d43 between neighboring second contact plugs 43 is selected from between 0.1 times and 10 times, in particular from between 0.5 times and 5 times the vertical dimension d22 of the compensation region 22. Basically, the larger the distance d43 between neighboring second plugs 43 the longer it takes to charge or discharge the second junction capacitance and the lower the gradient of the drain-source current $I_{DS}$ and/or the drain-source voltage $V_{DS}$.

According to another example, the second contact plugs 43 are implemented such that the distance d43 between neighboring second plugs 43 is dependent on a (shortest) distance between the first surface 101 of the semiconductor body 100 and the drain region 23 or the buffer region 24. According to one example, the distance d43 between neighboring second contact plugs 43 is selected from between 0.1 times and 10 times, in particular from between 0.5 times and 5 times of this distance between the first surface 101 of the semiconductor body 100 and the drain region 23 or the buffer region 24.

According to another example, the second contact plugs 43 are implemented such that the distance d43 between neighboring second plugs 43 is between 5 micrometers and 100 micrometers, in particular between 10 micrometers and 50 micrometers.

Charging and discharging the second junction capacitance, however, is not only dependent on the distance between neighboring second contact plugs 43, but also on a dimension of the second contact plugs 43 in the direction in which the second contact plugs 43 are spaced apart from each other. According to one example, a length 143 of the second contact plugs 43 is between 0.001 times and 10 times the distance d43 between neighboring second contact plugs 43. According to another example, the length is between 200 nanometers and 50 micrometers (μm).

A width of the second contact plugs 42, which is a dimension in a direction perpendicular to the direction of the length 143, is between 0.01 times and 0.9 times the distance between neighboring gate trenches. According to one example, the width is between 200 nanometers and 1000 nanometers.

Optionally, each of the second contact plugs 43 and/or the optional second contact regions 23 adjoin a respective intermediate region 24 that has the same doping type as the compensation regions 22 and a doping concentration that is between the doping concentration of the compensation regions 22 and the contact regions 23. According to one example, the doping concentration of the intermediate regions 24 essentially equals the doping concentration of the body regions 11. According to another example, the doping concentration of the intermediate regions 24 is at least 10 times the doping concentration of the compensation regions 22. The intermediate regions 24 connect the compensation regions 22 to the second contact plugs 43.

According to one example, a plurality of intermediate regions 24 are embedded in each of the compensation regions 22, wherein each intermediate region 24 is arranged between the compensation region 22 and a respective second contact plug 43. According to one example, the intermediate regions 24 are spaced apart from each other. According to one example, a distance d24 between two neighboring intermediate regions 24 is selected: from between 0.1 times and 10 times, in particular from between 0.5 times and 5 times, of the vertical dimension d22 of the compensation region 22; from between 0.1 times and 10 times, in particular from between 0.5 times and 5 times, of the distance between the first surface 101 of the semiconductor body 100 and the drain region 23 or the buffer region 24; or from between 5 micrometers and 100 micrometers, in particular between 10 micrometers and 50 micrometers. A length 124 of the buffer regions 24 is greater than the length 143 of the second contact plugs 43, for example. According to one example, the length of the buffer regions 24 is between 1.05 times and 1.2 times the length of the second contact electrodes 43.

In the following, A43 denotes a first overall cross sectional area of the second contact plugs 43 connected to one compensation region 22. Equivalently, A42 denotes the overall cross sectional area of the first contact plugs 42 connected to one or more body regions 11 adjoining the same drift region 21. According to one example, an average $A42_{AVG}$ of the first cross sectional areas A42 is greater than an average $A43_{AVG}$ of the second cross sectional areas A43. According to one example, the first average cross sectional area $A42_{AVG}$ is at least 2 times, at least 5 times or at least 10 times the second average cross sectional area $A43_{AVG}$. According to another example, a total first cross sectional area $A42_{TOT}$, which is the sum of the first cross sectional areas A42, is greater than a second total cross sectional area $A43_{TOT}$, which is the sum of the second cross sectional areas A43. According to one example, the first total cross sectional area $A42_{TOT}$ is at least 2 times, at least 5 times or at least 10 times the second total cross sectional area $A43_{TOT}$.

In the examples illustrated in FIGS. 3 and 5A to 5C, the body regions 11 are separated from the compensation regions 22 by the gate electrodes 13 and the gate dielectrics 14. According to another example illustrated in FIG. 6, isolation regions 51 are arranged between the body regions 11 and the compensation regions 22. Referring to FIG. 6 these isolation regions 51 may include trenches that extend from the first surface 101 into the semiconductor body, wherein these trenches are filled with an insulator such as, for example, an insulating solid, an insulating gas, a vacuum, or a combination thereof (such as an insulating solid covering trench sidewalls and an insulating gas or a vacuum filling a residual trench). In the vertical direction, these isolation regions 51 extend through the body regions 11 into the drift region 21.

In example shown in FIG. 6, the gate electrodes 13 of two transistor cells 10 are formed by one trench electrode, wherein the source regions 12 and the body regions 11 of the two transistor cells 10 are separated from each other by the gate electrode 13 and the gate dielectric 14. The source and body regions 12, 11 of each transistor cell 10 are connected to the source metallization 41 via a respective first contact plug 42.

FIG. 7 illustrates a modification of the isolation region shown in FIG. 6. In this example, the isolation region includes an electrode 52 embedded in the insulating material 51. The electrode 52 may be connected to the source node S (as illustrated). Alternatively, the electrode 52 may be floating (not illustrated).

FIG. 8 illustrates another example of an isolation region. In this example, the isolation region arranged between a compensation region 22 and a body region 11 includes a semiconductor region 71 of a doping type complementary to the doping type of the compensation region 22 and the body region 11 (and the same doping type as the source region 12). In this way, a junction isolation with two pn-junctions is formed between the compensation region 22 and the body region 11. The source region 12 is separated from the isolation region 71 by a semiconductor region of the same doping type as the body region 11 and may be separated from the isolation region 71 by a section of the body region 11.

Figure 9:
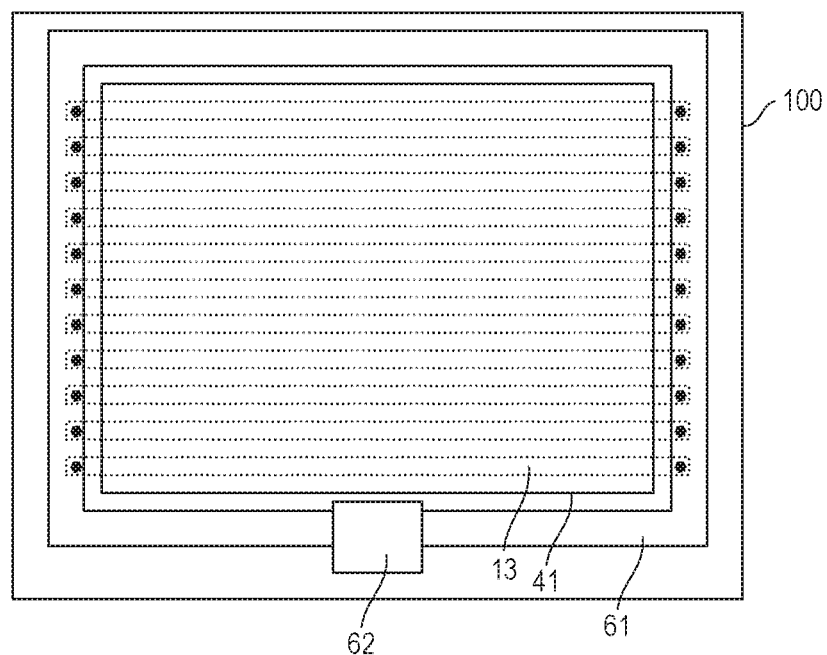
FIG. 9 illustrates a top view of a transistor device according to one example.

Referring to the above, the gate electrodes 13 of the individual transistor cells 10 are connected to a gate node G of the transistor device. According to one example, illustrated in FIG. 9, the gate node G of the transistor device is formed by a gate pad 62 that is arranged above the first surface 101 of the semiconductor body and may be arranged on top of the insulation layer 44. A gate runner 61 is connected to the gate pad 62, surrounds the source metallization 41 and is connected to the gate electrodes 13 (which are only schematically illustrated by dotted lines in FIG. 9). In this example, the gate electrodes 13 extend beyond the source metallization 41 in lateral directions of the semiconductor body 100, and the gate runner 61 is connected to those sections of the gate electrodes 13 extending beyond the source metallization 41. The gate runner 61 is connected to the gate electrodes 13 via contact plugs, wherein these contact plugs are only schematically illustrated by black dots in FIG. 8.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A transistor device, comprising:
a semiconductor body;
a plurality of drift regions of a first doping type;
a plurality of compensation regions of a second doping type adjoining the drift regions; and
a plurality of transistor cells each comprising a body region adjoining a respective one of the plurality of drift regions, a source region adjoining the body region, and a gate electrode adjacent the body region and dielectrically insulated from the body region by a gate dielectric,
wherein the source regions of the plurality of transistor cells are connected to a source node,
wherein the body regions of the plurality of transistor cells are separated from the plurality of compensation regions in the semiconductor body, and
wherein the plurality of compensation regions are ohmically connected to the source node,
wherein the body regions of the plurality of transistor cells are separated from the plurality of compensation regions by semiconductor regions of a doping type complementary to the doping type of the body regions and the compensation regions.

2. The transistor device of claim 1, wherein the gate electrodes and the gate dielectrics of the plurality of transistor cells are arranged in gate trenches of the semiconductor body.

3. The transistor device of claim 1, further comprising:
a source metallization arranged above a first surface of the semiconductor body,
wherein the source metallization:
is connected to the source node or forms the source node;
is connected to each of the source regions of the plurality of transistor cells through at least one first contact plug; and
is connected to each of the plurality of compensation regions through at least one second contact plug.

4. The transistor device of claim 3, wherein the source metallization is connected to each of the plurality of compensation regions through a plurality of second contact plugs that are spaced apart from each other.

5. The transistor device of claim 4, wherein each of the compensation regions has a dimension in a vertical direction of the semiconductor body, and wherein a distance between two neighboring second contact plugs of the plurality of second contact plugs is between 0.1 times and 10 times the vertical dimension of the respective compensation region.

6. The transistor device of claim 4, wherein a distance between two neighboring second contact plugs of the plurality of second contact plugs is greater than 10 micrometers.

7. The transistor device of claim 4, further comprising:
a plurality of intermediate regions of the second doping type,
wherein each of the plurality of intermediate regions is arranged between a respective one of the plurality of second contact plugs and the respective compensation region,
wherein a doping concentration of each of the plurality of intermediate regions is higher than a doping concentration of the respective compensation region, and
wherein the plurality of intermediate regions are spaced apart from each other.

8. The transistor device of claim 7, wherein each of the compensation regions has a dimension in a vertical direction of the semiconductor body, and wherein a distance between two neighboring intermediate regions of the plurality of intermediate regions is between 0.1 times and 10 times the vertical dimension of the respective compensation region.

9. The transistor device of claim 1, wherein an overall cross sectional area of the first contact plugs is greater than an overall cross sectional area of the second contact plugs.

10. The transistor device of claim 1, wherein the plurality of compensation regions and the body regions of the plurality of transistor cells are elongated in a first lateral direction of the semiconductor body and parallel to each other.

11. The transistor device of claim 1, further comprising: a drain region coupled to the plurality of drift regions.

12. The transistor device of claim 11, wherein the drain region is spaced apart from the transistor cells in a vertical direction of the semiconductor body.

13. A transistor device, comprising:
a semiconductor body;
a plurality of drift regions of a first doping type;
a plurality of compensation regions of a second doping type adjoining the drift regions;
a plurality of transistor cells each comprising a body region adjoining a respective one of the plurality of drift regions, a source region adjoining the body region, and a gate electrode adjacent the body region and dielectrically insulated from the body region by a gate dielectric; and
a source metallization arranged above a first surface of the semiconductor body,
wherein the source regions of the plurality of transistor cells are connected to a source node,
wherein the body regions of the plurality of transistor cells are separated from the plurality of compensation regions in the semiconductor body,
wherein the plurality of compensation regions are ohmically connected to the source node,
wherein the source metallization is connected to the source node or forms the source node, is connected to each of the source regions of the plurality of transistor cells through at least one first contact plug, and is connected to each of the plurality of compensation regions through a plurality of second contact plugs that are spaced apart from each other,
wherein each of the compensation regions has a dimension in a vertical direction of the semiconductor body,
wherein a distance between two neighboring second contact plugs of the plurality of second contact plugs is between 0.1 times and 10 times the vertical dimension of the respective compensation region.

14. The transistor device of claim 13, wherein the gate electrodes and the gate dielectrics of the plurality of transistor cells are arranged in gate trenches of the semiconductor body, and wherein the body regions of the plurality of transistor cells are separated from the plurality of compensation regions by the gate trenches.

15. The transistor device of claim 13, wherein the body regions of the plurality of transistor cells are separated from the plurality of compensation regions by trenches in the semiconductor body that have at least their surfaces covered with an insulator.

16. A transistor device, comprising:
a semiconductor body;
a plurality of drift regions of a first doping type;
a plurality of compensation regions of a second doping type adjoining the drift regions;
a plurality of transistor cells each comprising a body region adjoining a respective one of the plurality of drift regions, a source region adjoining the body region, and a gate electrode adjacent the body region and dielectrically insulated from the body region by a gate dielectric; and
a source metallization arranged above a first surface of the semiconductor body,
wherein the source regions of the plurality of transistor cells are connected to a source node,
wherein the body regions of the plurality of transistor cells are separated from the plurality of compensation regions in the semiconductor body, and
wherein the plurality of compensation regions are ohmically connected to the source node,
wherein the source metallization is connected to the source node or forms the source node, is connected to each of the source regions of the plurality of transistor cells through at least one first contact plug, and is connected to each of the plurality of compensation regions through a plurality of second contact plugs that are spaced apart from each other,
wherein a distance between two neighboring second contact plugs of the plurality of second contact plugs is greater than 10 micrometers.

17. The transistor device of claim 16, wherein the gate electrodes and the gate dielectrics of the plurality of transistor cells are arranged in gate trenches of the semiconductor body, and wherein the body regions of the plurality of transistor cells are separated from the plurality of compensation regions by the gate trenches.

18. The transistor device of claim 16, wherein the body regions of the plurality of transistor cells are separated from the plurality of compensation regions by trenches in the semiconductor body that have at least their surfaces covered with an insulator.

19. A transistor device, comprising:
a semiconductor body;
a plurality of drift regions of a first doping type;
a plurality of compensation regions of a second doping type adjoining the drift regions;
a plurality of transistor cells each comprising a body region adjoining a respective one of the plurality of drift regions, a source region adjoining the body region, and a gate electrode adjacent the body region and dielectrically insulated from the body region by a gate dielectric;
a source metallization arranged above a first surface of the semiconductor body; and
a plurality of intermediate regions of the second doping type,
wherein the source regions of the plurality of transistor cells are connected to a source node,
wherein the body regions of the plurality of transistor cells are separated from the plurality of compensation regions in the semiconductor body, and
wherein the plurality of compensation regions are ohmically connected to the source node,
wherein the source metallization is connected to the source node or forms the source node, is connected to each of the source regions of the plurality of transistor cells through at least one first contact plug, and is connected to each of the plurality of compensation regions through a plurality of second contact plugs that are spaced apart from each other,
wherein each of the plurality of intermediate regions is arranged between a respective one of the plurality of second contact plugs and the respective compensation region,
wherein a doping concentration of each of the plurality of intermediate regions is higher than a doping concentration of the respective compensation region,
wherein the plurality of intermediate regions are spaced apart from each other.

20. The transistor device of claim 19, wherein each of the compensation regions has a dimension in a vertical direction of the semiconductor body, and wherein a distance between two neighboring intermediate regions of the plurality of intermediate regions is between 0.1 times and 10 times the vertical dimension of the respective compensation region.

21. The transistor device of claim 19, wherein the gate electrodes and the gate dielectrics of the plurality of transistor cells are arranged in gate trenches of the semiconductor body, and wherein the body regions of the plurality of transistor cells are separated from the plurality of compensation regions by the gate trenches.

22. The transistor device of claim 19, wherein the body regions of the plurality of transistor cells are separated from the plurality of compensation regions by trenches in the semiconductor body that have at least their surfaces covered with an insulator.

\* \* \* \* \*